(12) United States Patent
Kabir et al.

(10) Patent No.: US 10,741,485 B2
(45) Date of Patent: Aug. 11, 2020

(54) NANOSTRUCTURE ENERGY STORAGE AND ELECTRONIC DEVICE

(71) Applicant: Smoltek AB, Göteborg (SE)

(72) Inventors: M Shafiqul Kabir, Västra Frölunda (SE); Anders Johansson, Öckerö (SE); Muhammad Amin Saleem, Göteborg (SE); Peter Enoksson, Stockholm (SE); Vincent Desmaris, Göteborg (SE); Rickard Andersson, Göteborg (SE)

(73) Assignee: SMOLTEK AB, Gothenburg (SE)

( * ) Notice: Subject to any disclaimer, the term of this patent is extended or adjusted under 35 U.S.C. 154(b) by 0 days.

(21) Appl. No.: 16/550,706

(22) Filed: Aug. 26, 2019

(65) Prior Publication Data

US 2019/0385943 A1    Dec. 19, 2019

Related U.S. Application Data

(63) Continuation of application No. 16/078,331, filed as application No. PCT/SE2017/050177 on Feb. 24, 2017, now Pat. No. 10,438,880.

(30) Foreign Application Priority Data

Feb. 29, 2016 (SE) ...................................... 1650263

(51) Int. Cl.
*H01L 21/02* (2006.01)
*H01L 23/498* (2006.01)
(Continued)

(52) U.S. Cl.
CPC ......... *H01L 23/49827* (2013.01); *H01G 4/35* (2013.01); *H01L 21/486* (2013.01);
(Continued)

(58) Field of Classification Search
CPC ... H01L 51/48; H01L 51/444; H01L 45/1253; H01L 28/60; H01L 28/40;
(Continued)

(56) References Cited

U.S. PATENT DOCUMENTS 7,416,954 B2    8/2008    Block et al.
7,488,624 B2    2/2009    Horton et al.
(Continued)

OTHER PUBLICATIONS

International Search Report from International Application No. PCT/SE2017/050177, dated May 15, 2017.
(Continued)

*Primary Examiner* — S. V. Clark
(74) *Attorney, Agent, or Firm* — Westman, Champlin & Koehler, P.A.

(57) ABSTRACT

A nanostructure energy storage device comprising: at least a first plurality of conductive nanostructures provided on an electrically insulating surface portion of a substrate; a conduction controlling material embedding each nanostructure in said first plurality of conductive nanostructures; a first electrode connected to each nanostructure in said first plurality of nanostructures; and a second electrode separated from each nanostructure in said first plurality of nanostructures by said conduction controlling material, wherein said first electrode and said second electrode are configured to allow electrical connection of said nanostructure energy storage device to an integrated circuit.

26 Claims, 4 Drawing Sheets

(51) Int. Cl.
  *H01G 4/35* (2006.01)
  *H01L 23/50* (2006.01)
  *H01L 21/48* (2006.01)
  *H01L 23/14* (2006.01)
  *H01L 23/538* (2006.01)

(52) U.S. Cl.
  CPC ............ *H01L 23/147* (2013.01); *H01L 23/50* (2013.01); *H01L 23/5389* (2013.01); *H01L 23/49811* (2013.01)

(58) Field of Classification Search
  CPC . H01L 2924/19042; H01L 2924/30105; H01L 23/5223; H01L 51/102; H01L 21/02603; H01L 24/85; H01L 31/053; H01L 29/413
  USPC .................. 257/532, 686, 723, 724, 777
  See application file for complete search history.

(56) References Cited

U.S. PATENT DOCUMENTS

| | | | |
|---|---|---|---|
| 7,518,881 | B2 | 4/2009 | Cornelius |
| 8,263,434 | B2 | 9/2012 | Pagaila et al. |
| 8,385,046 | B2 * | 2/2013 | Palusinski ............... H01G 4/06 361/303 |
| 8,426,961 | B2 | 4/2013 | Shih et al. |
| 8,618,651 | B1 | 12/2013 | Yee |
| 8,928,132 | B2 | 1/2015 | Choi et al. |
| 9,236,442 | B2 | 1/2016 | Bhagavat et al. |
| 9,257,383 | B2 | 2/2016 | England |
| 2004/0108587 | A1 | 6/2004 | Chudzik et al. |
| 2006/0043583 | A1 | 3/2006 | Tamagawa et al. |
| 2006/0214262 | A1 | 9/2006 | Mosley et al. |
| 2007/0035030 | A1 | 2/2007 | Horton et al. |
| 2008/0305603 | A1 | 12/2008 | Mosley et al. |
| 2010/0187683 | A1 | 7/2010 | Bakir et al. |
| 2010/0266897 | A1 | 10/2010 | Lee et al. |
| 2011/0021016 | A1 | 1/2011 | Awano et al. |
| 2011/0058308 | A1 * | 3/2011 | Nishi .................... B82Y 30/00 361/503 |
| 2011/0140268 | A1 | 6/2011 | Cheah et al. |
| 2014/0145300 | A1 | 5/2014 | Bhagavat et al. |
| 2014/0321093 | A1 | 10/2014 | Pande et al. |
| 2015/0200242 | A1 | 7/2015 | England |
| 2015/0250058 | A1 | 9/2015 | Ramachandran et al. |
| 2018/0102470 | A1 | 4/2018 | Das et al. |
| 2018/0374658 | A1 * | 12/2018 | Gao ...................... H01G 11/26 |
| 2019/0228910 | A1 * | 7/2019 | Goelzhaeuser ........... B32B 9/00 |
| 2019/0288133 | A1 * | 9/2019 | Noyes .................... F27B 3/085 |
| 2020/0091065 | A1 * | 3/2020 | Kabir ..................... H01L 28/40 |

OTHER PUBLICATIONS

The Written Opinion from International Application No. PCT/SE2017/050177, dated May 15, 2017.

Communication from EP Application No. 17760396.6, dated Apr. 3, 2019.

* cited by examiner

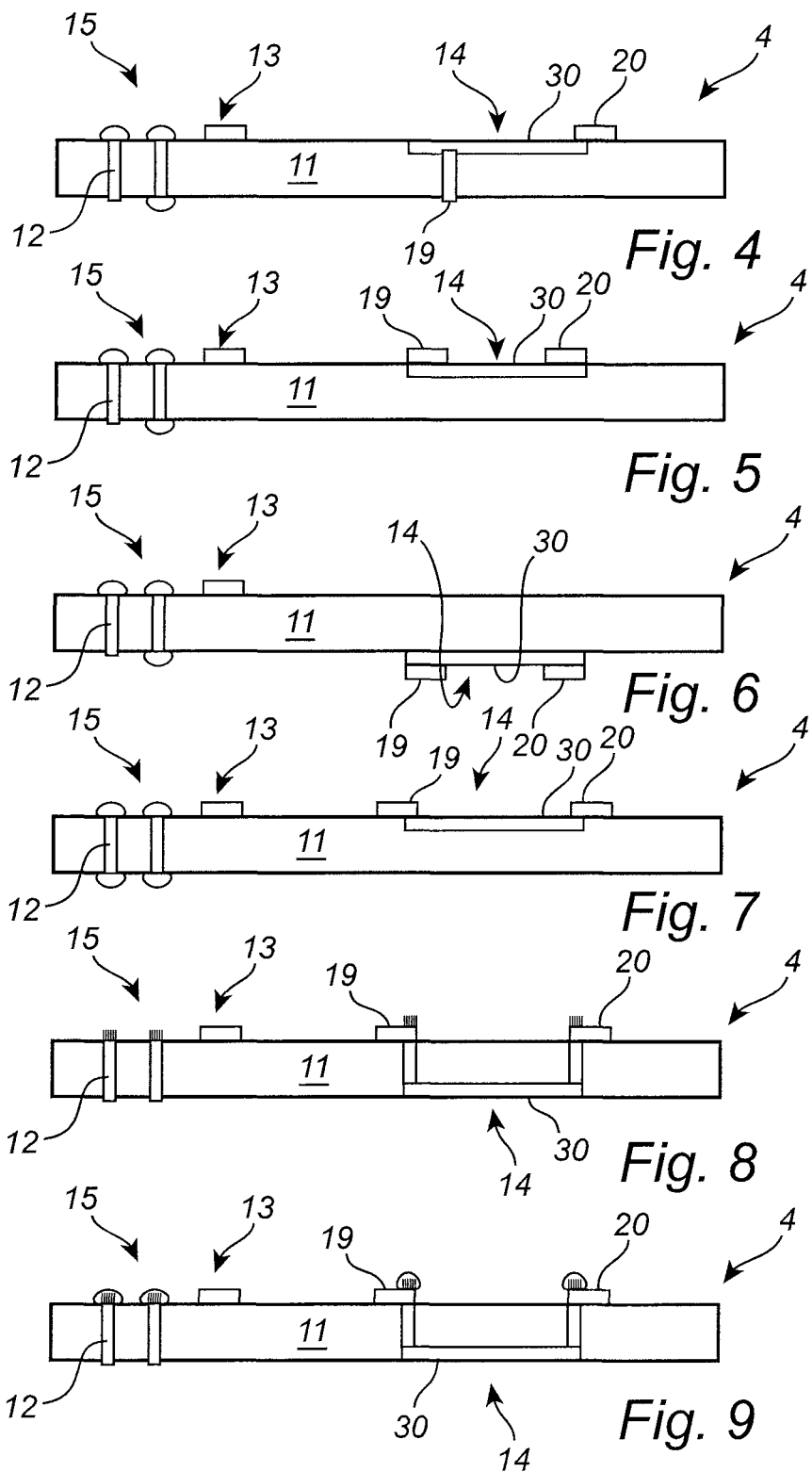

NANOSTRUCTURE ENERGY STORAGE AND ELECTRONIC DEVICE

CROSS-REFERENCE TO RELATED APPLICATION

This Application is a Continuation of U.S. application Ser. No. 16/078,331, filed Aug. 21, 2018 which is a Section 371 National Stage Application of International Application No. PCT/SE2017/050177, filed Feb. 24, 2017 and published as WO 2017/151040 on Sep. 8, 2017, in English, which claims the benefit of priority of Swedish Application No. 1650263-5, filed on Feb. 29, 2016, the entire contents of which are hereby incorporated by reference in their entirety.

FIELD OF THE INVENTION

The present invention relates to a nanostructure energy storage device and to an electronic device comprising such a nanostructure energy storage device.

BACKGROUND OF THE INVENTION

Electronic devices need electrical energy to operate. In a portable electronic device, a battery is typically provided, and electrical energy is drawn from the battery to power integrated circuits comprised in the electronic device. Moreover, a number of driving factors that are continuously improving the system level performance including but not limited to smaller form-factor with higher data transfer rate, signal integrity, memory bandwidth, power and thermal management capability etc. It is of highest importance that the today's integrated and portable products are continuously striving to improve at least those metrics. The maturity of the Through Silicon Via (TSV) technology has opened up enormous possibilities for homogenous and heterogeneous integration of logic, analog, sensors and memory co-located closely together in a small form-factor assembly. Moreover, TSV technology breakthrough and maturity has enabled exploiting the possibilities of advancing the interposer packaging technology to the next level. Some good examples of interposers including TSV are disclosed in U.S. Pat. Nos. 8,426,961B2, 8,928,132B2, 8,426,961B2, 8,263,434B2. Adaptation of interposer technology is steadily increasing in the semiconductor industry. Interposer technology brings multiples of benefits including enabling heterogeneous die packaging, shorter interconnect lines by means of TSVs, integrated passive devices (IPD), vertical package integration etc. Such integration enables to gain high density I/O so that different types of dies can be located near to each other on a TSV interposer e.g. logic and memory. Such technology is also known as 2.5D packaging technology. Moreover, silicon dies can be stacked tier-to-tier on top of each other, which reduces the physical area for defined components. Such tier-to-tier stacking is called 3D packaging technology.

However, integration of such densely populated dies may come with a price. Many low-power, high speed integrated circuits are extremely sensitive to electrical noise generated by the continuous switching of the transistors located in the circuit blocks. A known solution to this problem is to connect the circuit with a so called decoupling capacitor to minimize the power fluctuation induced noise. A decoupling capacitor essentially stores charge locally, which can then give out required energy to compensate for any sudden fluctuations or voltage variations during transistor switching stages and thereby minimize any voltage noise so that the circuit can continue functioning smoothly, and thereby enhanced performance is achieved.

It is also known that the impact of the inductance becomes more crucial as the frequency of the circuit goes up. Hence, an important improvement is to have such decoupling capacitor as close as possible to the intended circuit, for which it should serve to reduce the parasitic inductance coming from the interconnect lines. Many approaches have been made to produce integrated decoupling capacitor, e.g. exploiting part of gate dielectric layer, exploiting the spaces between the metal layers of the circuit, multi-layer dissimilar materials stacked capacitor structures, etc. Such approaches however suffer from either the need for a substantial footprint of active silicon area, dielectric leakage, parasitic resistance, or are limited by the fundamental limitations in increasing in capacitance per unit area defined by the parallel plate area or from processing complexity or cost. A good example of different approaches is disclosed in the U.S. Pat. No. 7,416,954B2.

Advantages of having an integrated silicon based capacitor on an interposer are explained in the U.S. Pat. No. 7,518,881B2. Such integration enables to reduce voltage noise on an integrated (IC) circuit device that may be connected to the capacitor integrated interposer. The main advancement of the disclosure was that the capacitor was brought closer to the IC by having it integrated at the surface of the interposer where the IC will be connected. A variation of such an approach is disclosed in U.S. Pat. No. 7,488,624B2 where it is described how to configure multiples of silicon based integrated capacitors in an interposer. Yet another example of an integrated capacitor is disclosed in U.S. Pat. No. 8,618,651B1, where silicon capacitors are formed within blind TSV vias. Another example of silicon trench based capacitor is disclosed in U.S. Pat. No. 9,236,442B2, where high aspect ratio silicon trenches are used to manufacture capacitor devices. A variation of a trench capacitor manufacturing method is disclosed in U.S. Pat. No. 9,257,383B2.

Hence, traditional silicon based embedded high aspect ratio trench capacitor technology has matured to be used for volume production and may be found in today's smartphone packaging. However, given the trend in miniaturization, the potential of the silicon based capacitor technology is limited by the ability to tailor the capacitor density per unit area, undesired parasitic resistances, increased film stress in the silicon substrate during processing, escalated manufacturing complexity and economy of costs per functions.

Furthermore, for many integrated circuits, it would be desirable to also store energy locally. However, local energy storage in an integrated circuit requires the use of valuable space and/or processing that either may not be compatible with standard so called front end manufacturing processes or may not be economically advantageous or combination thereof.

Hence, there are apparently a number of avenues where the interposer assembly technology can further be improved and the present described invention disclosures intends to contribute to enable a smarter, better and cost effective interposer with reduced film stress, and added functionality to be used as an assembly platform.

SUMMARY

In view of the above-mentioned and other drawbacks of the prior art, it is an object of the present invention to provide for local energy storage and/or decoupling without having to modify the integrated circuit itself.

According to a first aspect of the present invention, it is therefore provided an interposer device for arrangement between an integrated circuit and a device substrate to interconnect the first integrated circuit and the device substrate through the interposer device, the interposer comprising: an interposer substrate having an electrically insulating surface portion; a plurality of conducting vias extending through the interposer substrate; a conductor pattern provided on the electrically insulating surface portion of the interposer substrate, the conductor pattern being conductively connected to the vias and defining connection locations for connection with at least one of the integrated circuit and the device substrate, and a nanostructure energy storage device comprising: at least a first plurality of conductive nanostructures provided on the electrically insulating surface portion of the interposer substrate; a conduction controlling material embedding each nanostructure in the first plurality of conductive nanostructures; a first electrode connected to each nanostructure in the first plurality of nanostructures; and a second electrode separated from each nanostructure in the first plurality of nanostructures by the conduction controlling material, wherein the first electrode and the second electrode are configured to allow electrical connection of the nanostructure energy storage device to the integrated circuit.

The first electrode may be conductively connected to the nanostructures, so that DC-current can flow from the first electrode to the nanostructures.

The interposer substrate may be made of an insulating material or material composition. Alternatively, the interposer substrate may comprise a conducting or semi-conducting base and an insulating coating to form an insulating surface portion of the interposer substrate at least where the nanostructures are provided. In embodiments, the insulating surface portion may be the entire surface of the interposer substrate. For example, the base material of the interposer substrate may be Si/doped Si, GaAs, SiC or InP, and the insulating coating may, for example, be an oxide, a nitride or an insulating polymer. In embodiments with a conducting or semiconducting substrate base, the insulating dielectric layer serves to isolate different metal vias and redistributions lines or layers from each other (and possibly also from the conducting or semiconducting base) to avoid any unwanted short circuits or electrical leakage. The dielectric layer in such cases may advantageously be plasma CVD deposited or ALD deposited or spin on glass coated or may be grown through oxidation or nitridation from the substrate using standard oxidation or nitridation processes used in the standard semiconductor processing schemes. In embodiments where the interposer substrate is made entirely of an insulating material, suitable materials include glass, various polyimides, alumina, and epoxy-based materials, such as SU-8. The conducting vias through the interposer substrate may advantageously be provided with a layer of diffusion barrier or dielectric barrier to stop diffusion of the metal to the interposer substrate.

By conduction controlling material should be understood any material that controls, such as prevents, electrical conduction between the second electrode and the nanostructures in the first plurality of nanostructures to allow for energy storage.

The present invention is based upon the realization that local energy storage and/or efficient and compact decoupling can conveniently be provided using an interposer device comprising a nanostructure energy storage device. In this way, considerable energy storage capability can be provided without the need for expensive and space consuming external components. Additionally, the local energy storage capability can be provided to already existing integrated circuits. Furthermore, the interposer device can be processed at higher temperatures than typical integrated circuits, allowing more freedom in the configuration of the nanostructures and/or a more cost-efficient processing.

In embodiments, the present invention thus contemplates to enable integrated capacitor interposer devices that may be tailored to be energy storage devices fulfilling both the capacitor and the energy storing requirements. Embodiments of the interposer device according to the present invention are also contemplated to be suitable to tailor the capacitance energy density needed for a given circuit need or the assembly requirements. Hence, embodiments of the present invention enable freedom of design and geometrical profile, cost effective processing and industrially scalability. In embodiments, the present invention also allows for controlling the growth of nanostructures as electrode materials to influence the electrode properties, crucial effective surface area enhancement and control over geometrical profile of charge storage devices.

According to various embodiments, the conductive nanostructures in the first plurality of conductive nanostructures may be vertical nanostructures grown on the interposer substrate. The use of grown nanostructures allows extensive tailoring of the properties of the nanostructures. For instance, the growth conditions may be selected to achieve a morphology giving a large surface area of each nanostructure, which may in turn increase the energy storage capacity of the nanostructure energy storage device.

The nanostructures may advantageously be carbon nanostructures, such as carbon nanofibers, carbon nanotubes or carbide-derived carbon nanostructures.

According to various embodiments, the first electrode may be arranged between the interposer substrate and each nanostructure in the first plurality of conductive nanostructures. In these embodiments, the nanostructures in the first plurality of nanostructures may be grown from the first electrode, that is, from a conductive material.

According to embodiments, the conduction controlling material may advantageously be arranged as a conformal coating on each nanostructure in the first plurality of conductive nanostructures.

According to embodiments, the second electrode may cover the conduction controlling material.

In some embodiments the first electrode may be a continuous electrode layer between the nanostructures in the first plurality of nanostructures and the insulating surface portion of the interposer substrate and the second electrode may be a continuous electrode layer covering the conduction controlling material such that the second electrode is separated from the first plurality of nanostructures by the conduction controlling material. In these embodiments, the conduction controlling material may advantageously be substantially conformal with the nanostructures, to provide for a very large total area of the second electrode.

According to various embodiments, moreover, the nanostructure energy storage device may further comprise a second plurality of conductive nanostructures embedded in the conduction controlling material. As for the nanostructures in the first plurality of nanostructures, the nanostructures in the second plurality of nanostructures may advantageously be grown on the interposer substrate.

In such embodiments, the second electrode may be conductively connected to each nanostructure in the second plurality of nanostructures.

In some embodiments, the second electrode may be arranged between the interposer substrate and each nanostructure in the second plurality of conductive nanostructures.

Each nanostructure in the second plurality of conductive nanostructures may advantageously be grown from the second electrode.

The second electrode, or a portion of the second electrode, may instead be connected to the tip of nanostructures in the second plurality of nanostructures. In such embodiments, the nanostructures may be grown, embedded in the conduction controlling material, and the tips of the nanostructures then be exposed by removal of conduction controlling material, for example through dry or wet etching or polishing.

According to further embodiments, the first electrode, or a portion of the first electrode, may also be connected to the tip of nanostructures in the first plurality of nanostructures. In such embodiments, the nanostructures may be grown, embedded in the conduction controlling material, and the tips of the nanostructures then be exposed by removal of conduction controlling material, for example through dry or wet etching or polishing. Accordingly, both the first electrode and the second electrode may be provided after growth of the nanostructures.

According to various embodiments, the nanostructure energy storage device may be a nanostructure capacitor, and the conduction controlling material may be a dielectric material. In a nanostructure capacitor, the conduction controlling material provides for energy storage by preventing electrical conduction from the conductive nanostructures in the first plurality of nanostructures to the second electrode. Hereby, energy can be stored through accumulation of charge at the nanostructure—dielectric interface. The dielectric may advantageously be a so-called high-k dielectric. The high k-dielectric materials e.g. be HfOx, TiOx, TaOx or other well-known high k dielectrics. Alternatively, the dielectric can be polymer based e.g. polypropylene, polystyrene, poly(p-xylylene), parylene etc. Other well-known dielectric materials, such as SiOx or SiNx, etc may also be used as the conduction controlling layer. Any other suitable conduction controlling materials may appropriately be used. The conduction controlling materials maybe deposited via CVD, thermal processes, ALD or spin coating or spray coating or any other suitable method used in the industry.

According to other embodiments, the nanostructure energy storage device may be a nanostructure battery, and the conduction controlling material may be a solid electrolyte. In a nanostructure battery, the conduction controlling material provides for energy storage by allowing transport of ions through the solid electrolyte. Solid electrolytes may be chosen forms of solid crystals, ceramic, garnet or polymers or gel to act as electrolyte e.g. strontium titanate, yttria-stabilized zirconia, PMMA, KOH etc.

The interposer device according to various embodiments of the present invention may be configured to store a relatively large amount of energy to allow the nanostructure energy providing device to provide energy for operation of the integrated circuit connected to the interposer device. According to other embodiments, the nanostructure energy providing device may be configured to store a relatively small amount of energy needed to, for instance, allow the nanostructure energy providing device to function as a de-coupling capacitor to act as an electrical short for RF frequency, limiting the disturbance on the DC lines from voltage harmonic(s) or transient variations. According to yet further embodiments, the interposer device may include a plurality of nanostructure energy providing devices, which may provide mutually different functionalities.

Moreover, the interposer device according to various embodiments of the present invention may advantageously be included in an electronic component, further comprising an integrated circuit electrically connected to the conducting vias and/or the conductor pattern of the interposer device.

The electronic component may be comprised in an electronic device, such as a handheld electronic device.

According to a further aspect of the invention, it is provided an energy storage device comprising a substrate having an electrically insulating surface portion; at least a first plurality of conductive nanostructures provided on the electrically insulating surface portion of the interposer substrate; a conduction controlling material embedding each nanostructure in the first plurality of conductive nanostructures; a first electrode connected to each nanostructure in the first plurality of nanostructures; and a second electrode separated from each nanostructure in the first plurality of nanostructures by the conduction controlling material, wherein the first electrode and the second electrode are configured to allow electrical connection of the energy storage device to an external device.

In embodiments, the energy storage device (or the above-mentioned interposer device) may be comprised in an energy supply system of an electronic device (smart phone, laptop, sensor or any other handheld battery driven device). The energy storage device (or interposer device) may be directly connected to a battery of the electronic device, and/or be included in an energy management system of the electronic device, in such a way that the energy storage device can receive and store electrical energy, and supply the stored electrical energy to the electronic device when required. In particular, such stored energy can be used to either extend the regular batter life time, and/or improve the power management systems and/or tackle any unwanted power surge or ripples (voltage noise) such that extra power needed can be provided instantaneously.

According to a second aspect of the present invention, it is provided a method of manufacturing an interposer device for arrangement between an integrated circuit and a device substrate to interconnect the first integrated circuit and the device substrate through the interposer, the method comprising the steps of: providing an interposer substrate having an electrically insulating surface portion with a plurality of conducting vias extending through the interposer substrate, and a conductor pattern on the electrically insulating surface portion of the interposer substrate, the conductor pattern being conductively connected to the vias and defining connection locations for connection with at least one of the integrated circuit and the device substrate; forming at least a first plurality of conductive nanostructures on the electrically insulating surface portion of the interposer substrate; embedding each nanostructure in the first plurality of conductive nanostructures in a conduction controlling material; providing a first electrode in such a way that the first electrode is electrically connected to each nanostructure in the first plurality of nanostructures, and the first electrode is configured to allow connection thereof to the integrated circuit; and providing a second electrode in such a way that the second electrode is separated from each nanostructure in the first plurality of nanostructures by the conduction controlling material, and the second electrode is configured to allow connection thereof to the integrated circuit.

It should be noted that the steps of the method according to various embodiments of the present invention need not necessarily be carried out in any particular order, for instance, the nanostructures can be formed before the first and second electrodes are provided. Alternatively, one or both of the first and second electrodes may be provided before formation of the nanostructures.

The electrodes may be provided in any suitable manner, such as through photo-lithography, sputtering, evaporation, electroforming, silicidation etc.

According to embodiments, the step of forming the at least first plurality of conductive nanostructures may comprise the steps of: providing a patterned catalyst layer on the interposer substrate; and growing each nanostructure in the first plurality of conductive nanostructures from the catalyst layer. According to some embodiments, the electrodes may be the same material as the catalyst layer. According to some embodiments, the catalyst layer conveniently be thick enough to utilize the upper part of the catalyst layer as catalyst to grow nanostructures from and the bottom part to be used as electrodes.

Further embodiments of, and effects obtained through this second aspect of the present invention are largely analogous to those described above for the first aspect of the invention.

BRIEF DESCRIPTION OF THE DRAWINGS

These and other aspects of the present invention will now be described in more detail, with reference to the appended drawings showing an example embodiment of the invention, wherein:

FIGS. 4 to 9 schematically illustrate different embodiments of the interposer device in FIG. 1.

DETAILED DESCRIPTION OF EXAMPLE EMBODIMENTS

In the present detailed description, various embodiments of the energy storing interposer device is mainly described with reference to an energy storing interposer device comprising a nanostructure energy storage device in the form of a nanostructure capacitor.

It should be noted that this by no means limits the scope of the present invention, which equally well includes, for example, an interposer device comprising a nanostructure battery or a nanostructure capacitor and a nanostructure battery. Furthermore, the interposer substrate may comprise a semiconducting or conducting substrate base, and an insulating surface coating at least partly covering the substrate base.

Figure 1:
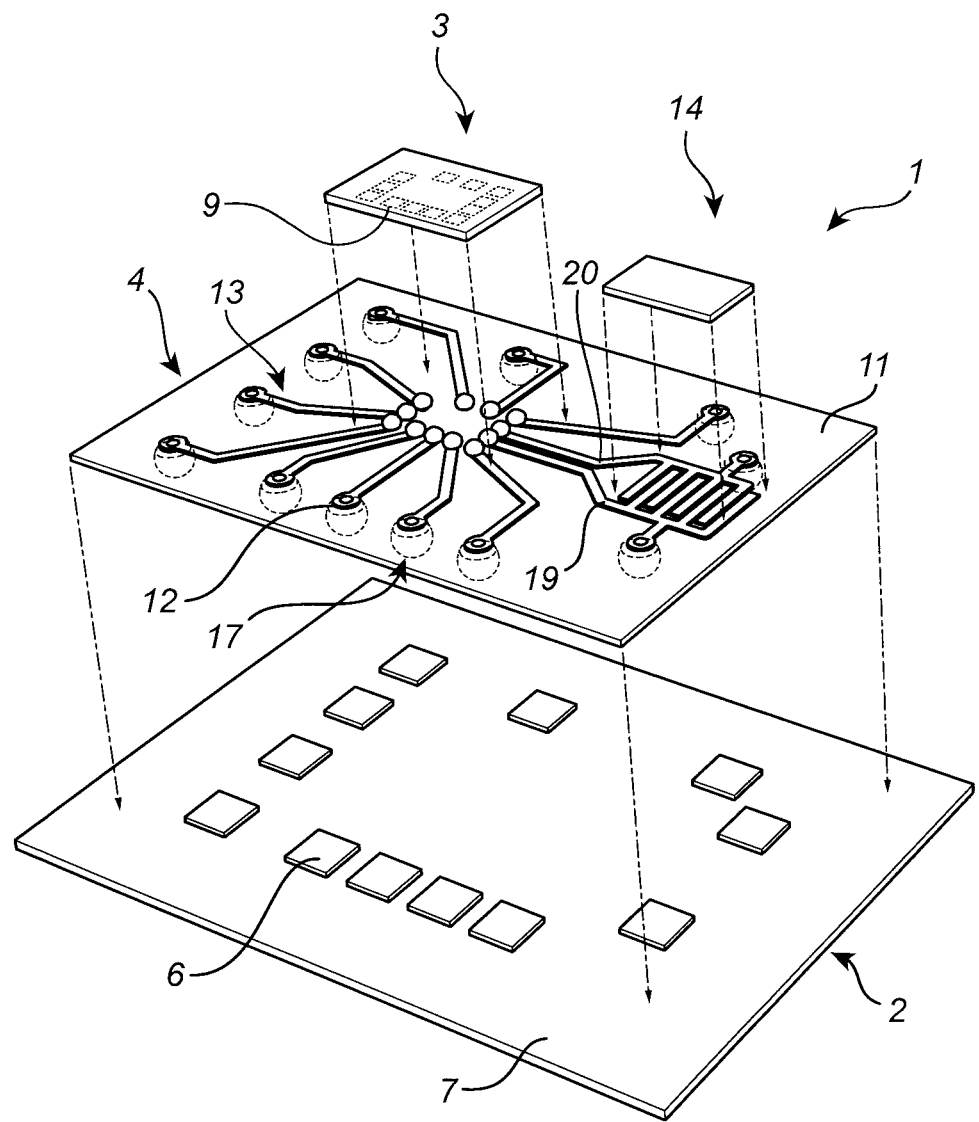
FIG. 1 schematically illustrates an application for an interposer device according to an example embodiment of the present invention, in the form of an electronic assembly.

FIG. 1 schematically illustrates an electronic assembly 1 comprising a device substrate, here in the form of a simplified printed circuit board (PCB) 2, an integrated circuit (IC) 3, and an energy storing interposer device 4 according to an example embodiment of the present invention.

The PCB includes PCB connection pads 6 formed on a PCB-substrate 7, and the IC 3 includes IC connection pads 9. As is schematically indicated in FIG. 1, the spacing between the IC connection pads 9 is considerably smaller than the spacing between the PCB connection pads 6.

The interposer device 1 in FIG. 1 comprises an interposer substrate 11, which is here provided as a substrate made of an electrically insulating material, a plurality of vias 12 extending through the interposer substrate 11, a conductor pattern 13, and a nanostructure energy storage device 14.

The conductor pattern 13 is conductively connected to the vias 12 and configured to define connection locations for connection with the IC 3 and with the PCB 2. In FIG. 1, this is exemplified by conductors extending from a first set of bumps 15 for connection to the IC connection pads 9 to the vias 12, with the vias here being directly connected through the interposer substrate 11 with a second set of bumps 17 for connection to the PCB connection pads 6.

The nanostructure energy storage device 14 comprises at least a first plurality of conductive nanostructures and a conduction controlling material embedding the nanostructures. These structures are not explicitly shown in FIG. 1, but will be described in greater detail below with reference to FIGS. 2A-B and FIG. 3.

In addition to the above-mentioned conductive nanostructures and conduction controlling material, the nanostructure energy storage device 14 comprises a first electrode 19 and a second electrode 20. In the example of FIG. 1, the first electrode 19 and the second electrode 20 are provided between the interposer substrate 11 and the nanostructures. Further, the first 19 and second 20 electrodes are interdigitated. In addition, the first 19 and second 20 electrodes are configured to allow electrical connection of the nanostructure energy storage device 14 to both the PCB connection pads 6 and the IC connection pads 9. Hereby, the nanostructure energy storage device 14 can, for example, be charged by electrical energy provided from the PCB connection pads, and discharged to the IC 3 through the IC connection pads 9. Thus, the interposer device 4 can function as a charge reservoir for the IC 3 connected to it.

It should be noted that many other electrode configurations are possible and may be advantageous depending on the particular application. It should also be noted that the configuration of the first and second electrodes to allow electrical connection to both the integrated circuit and to the device substrate may be advantageous regardless of the electrode configuration.

Figure 2A:
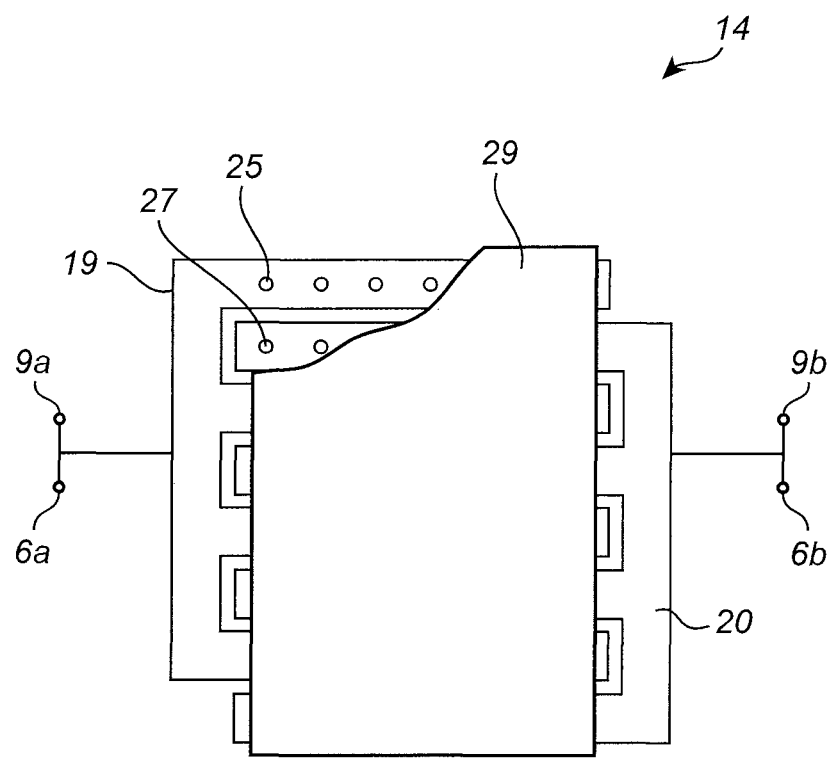
FIGS. 2A-B schematically show two embodiments of the nanostructure energy storage device comprised in the interposer device according to the present invention.

FIG. 2A is a schematic top view of the nanostructure energy storage device 14 in FIG. 1, with the conduction controlling material partly removed to expose some of the nanostructures comprised in the nanostructure energy storage device 14.

Referring to FIG. 2A, the nanostructure energy storage device 14 comprises a first plurality of conductive nanostructures 25 formed on the first electrode 19, and a second plurality of conductive nanostructure 27 formed on the second electrode 20. All nanostructures are embedded in conduction controlling material 29. In this example, the nanostructure energy storage device 14 may be a nanostructure capacitor, in which case the conduction controlling material 29 may be a dielectric material, such as a so-called high-k dielectric. As is schematically indicated in FIG. 2A, the first electrode 19 is connectable to a first PCB connection pad 6a and to a first IC connection pad 9a, and the second electrode 20 is connectable to a second PCB connection pad 6b and to a second IC connection pad 9b.

Figure 2B:
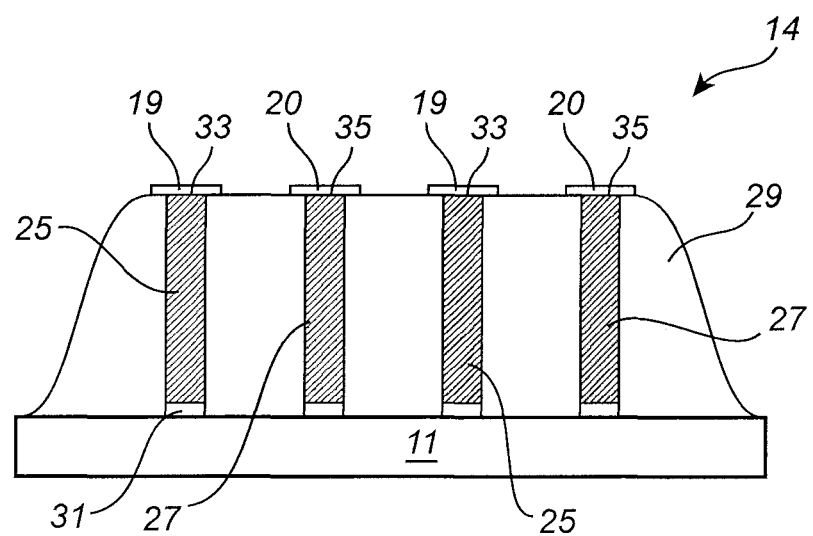

FIG. 2B is a cross-section view from the side schematically showing another embodiment of the nanostructure energy storage device 14 in FIG. 2A comprising a first plurality 25 and second plurality 27 of nanostructures grown from an electrically insulating surface portion of the interposer substrate 11. In particular, the nanostructures may have been grown as film/forest from an unpatterned (such as uniform) catalyst layer, or from a patterned catalyst layer 31 as is schematically indicated in FIG. 2B.

The nanostructures are embedded in a conduction controlling material 29, but the tips of the nanostructures have been exposed, for example through polishing or etching of the conducting controlling material 29. On top of the tips 33 of the nanostructures 25 in the first plurality of nanostructures, the first electrode 19 has been provided to achieve electrical contact between the first electrode 19 and each conductive nanostructure 25 in the first plurality of nanostructures. On top of the tips 35 of the nanostructures 27 in the second plurality of nanostructures, the second electrode 20 has been provided to achieve electrical contact between the second electrode 20 and each conductive nanostructure 27 in the second plurality of nanostructures.

Figure 3:
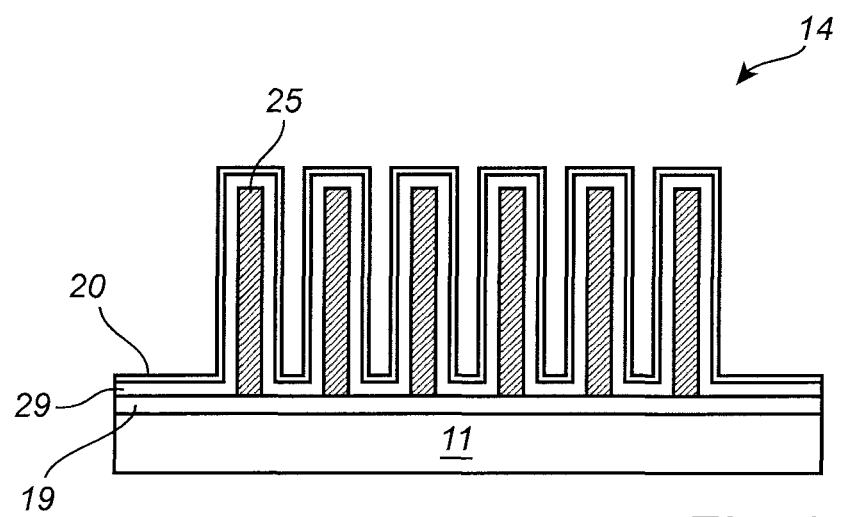
FIG. 3 schematically shows a further embodiment of the nanostructure energy storage device comprised in the interposer device according to the present invention.

FIG. 3 is a cross-section view from the side schematically showing another embodiment of the nanostructure energy storage device 14 in FIG. 1. In the embodiment in FIG. 3, there is no second plurality of nanostructures, but all of the nanostructures 25 belong to the above-mentioned first plurality of nanostructures formed on the first electrode 19. Further, the conduction controlling material 29 is provided as a conformal coating on the nanostructures 25, and the second electrode 20 is formed as a conformal coating on the conduction controlling material 29.

FIGS. 4 to 9 are schematic cross-section views of various embodiments of the energy storing interposer device 4 in FIG. 1 mainly intended to illustrate different possible locations and connections of the nanostructure energy storage device 14.

Referring first to FIG. 4, the nanostructure-conduction controlling material assembly 30 is embedded in the interposer substrate 11, and the first electrode 19 comprises a via connection through the interposer substrate 11.

In FIG. 5, the nanostructure-conduction controlling material assembly 30 is again embedded in the interposer substrate 11. Here, however, the first electrode 19 and the second electrode 20 are both at least partly provided on top of the nanostructure-conduction controlling material assembly 30.

In FIG. 6, the nanostructure-conduction controlling material assembly 30 is arranged on the side of the interposer 4 facing the PCB 2.

FIG. 7 schematically shows a variation of the interposer 4 in FIG. 5, where the first 19 and second electrodes 20 are partly on the nanostructure-conduction controlling material assembly 30 and partly directly on the interposer substrate 11.

FIG. 8 and FIG. 9 show other variations of the interposer, where the nanostructure-conduction controlling material assembly 30 is arranged on one side of the interposer 4 and the first 19 and second 20 electrodes are both routed through the interposer substrate 11 to the other side of the interposer 4. In these figures, the connection locations 15 are at least partly formed by conductive nanostructures.

Any of the previously described embodiments are suitable to be fabricated at a wafer level processes and panel level processes used in the industry. They may conveniently address as wafer level interposer processing and panel level interposer processing respectively. In wafer level processing typically a circular shaped substrate is used, size ranging from 2 inch to 12 inch wafers. In the panel level processing, the size is defined by the machine capacity and can be circular or rectangular or square ranging larger sizes typically but not limited to 12 to 100 inches. Panel level processing is typically used in producing smart televisions. Hence the size can be as the size of a television or larger. The larger the interposer substrate size, the cost effective it becomes for individual interposer substrate to be used in the semiconductor industry for assembly. In an aspect for wafer level processes, the at least one of the embodiment described above is processed at a wafer level in a semiconductor processing foundry. In another aspect, for panel level processes, the at least one of the embodiments described above is processed using panel level processing. Depending on the design requirements, after processing, the interposer wafer or panel level wafer is cut into smaller pieces utilizing standard dicing, plasma dicing or laser cutting. In another aspect, the dicing, plasma dicing or laser cutting is done after the chips/dies are assembled on the interposer at a wafer or panel level. Such singulation process step can be configured through dicing or plasma dicing or laser cutting to tailor the shape and size of the interposer is formed according to the need.

In an aspect of the use of any one of the above mentioned interposer embodiments, the energy storing interposer may conveniently be connected with the battery and/or power management unit in devices for example, smart phone, laptop, sensors or any other handheld battery driven devices such that the interposer according to the present invention can store energy. Such stored energy can be used either to extend the regular batter life time, and/or to improve the power management systems and/or to tackle any unwanted power surge or ripples (voltage noise) such that extra power needed can be provided instantaneously.

In addition, the following information is provided:

In one aspect, fabricated capacitor may be used as decoupling capacitor which will then have the role to act as an electrical short for RF frequency, limiting the disturbance on the DC lines from voltage harmonic(s) or transient variations.

The decoupling capacitors are best used when connected a DC lines to the ground as close as possible from the device. Hence in the present invention, one of the aspects is to position or manufacture such capacitor between two redistribution connecting lines on the surface of the interposer. In another aspect, the capacitor may be positioned or manufactured within the thickness of the interposer or in a recessed format of the interposer or at the bottom surface of the interposer.

In another aspect of using capacitor as a filtering capacitor (similarly to a DC block) should be located in series connection with a RF line and can be integrated within the via of the interposer or on one of the surfaces.

In one aspect of the filtering or de-coupling capacitors, they may be fully solid state devices. Therefore the device should be made of nanostructures connected or grown on the bottom electrode, before an insulating layer is deposited by means of PVD, CVD, ALD, before the top electrode is formed either using PVD, CVD, ALD or plating.

In another aspect for using the capacitor as storing devices, liquid, polymeric or Gel can be used as electrolyte joining two electrodes, located on the top of each other or simply interdigitated.

In another aspect of the present invention, an interposer device for arrangement between an integrated circuit and a device substrate to interconnect the first integrated circuit and the device substrate through said interposer device, said interposer comprising: an interposer substrate; a plurality of conducting vias extending through said interposer substrate; a conductor pattern on said interposer substrate, said conductor pattern being conductively connected to said vias and defining connection locations for connection with at least one of said integrated circuit and said device substrate, and a plurality of nanostructure formed on at least one of the micro-bumps, wherein the said micro-bumps are configured to allow electrical connection of said integrated circuit and a device substrate.

In some implementation, a thick layer of catalyst is used to grow the nanostructures as well as to be used as connecting electrodes. In such implementation, the catalyst can be thick layer of nickel, iron, platinum, palladium, nickel-silicide, cobalt, molybdenum, Au or alloys thereof, or can be combined with other materials from periodic table.

In one aspect of the present invention, the method for making one or more nanostructures includes: depositing a conducting helplayer on an upper surface of a substrate; depositing a patterned layer of catalyst on the conducting helplayer; growing the one or more nanostructures on the layer of catalyst; and selectively removing the conducting helplayer between and around the one or more nanostructures. In some implementations, the layer of catalyst is patterned after it is deposited. In some implementations, the substrate additionally comprises a metal underlayer, co-extensive with its upper surface, and which is covered by the conducting helplayer. In some implementations, the metal underlayer is patterned. In some implementations, the metal underlayer comprises one or more metals selected from: Cu, Ti, W, Mo, Co, Pt, Al, Au, Pd, P, Ni, silicide and Fe. In some implementations, the metal underlayer comprises one or more conducting alloys selected from: TiC, TiN, WN, and AlN. In some implementations, the metal underlayer comprises one or more conducting polymers.

The technology described herein can be utilized with a number of different materials as the helplayer. It is important to select helplayer materials and etching parameters so that the nanostructures can be used as a self-aligned mask layer during the etching of the helplayer. The choice of the helplayer material can depend on the material lying beneath the help layer.

The helplayer can also be a catalyst, as the selective removal process can also be used to remove any unwanted catalyst residuals between the grown nanostructures.

The catalyst can be nickel, iron, platinum, palladium, nickel-silicide, cobalt, molybdenum, Au or alloys thereof, or can be combined with other materials (e.g., silicon). The catalyst can be optional, as the technology described herein can also be applied in a catalyst-free growth process for nanostructures. Catalyst can also be deposited through spin coating of catalyst particles.

In some implementation, a layer of catalyst is used to grow the nanostructures as well as to be used as connecting electrodes. In such implementation, the catalyst can be a thick layer of nickel, iron, platinum, palladium, nickel-silicide, cobalt, molybdenum, Au or alloys thereof, or can be combined with other materials from periodic table.

In some implementations, any of the depositing is carried out by a method selected from: evaporating, plating, sputtering, molecular beam epitaxy, pulsed laser depositing, CVD, ALD, spin-coating or spray coating. In some implementations, the one or more nanostructures comprises carbon, GaAs, ZnO, InP, InGaAs, GaN, InGaN, or Si. In some implementations, the one or more nanostructures include nanofibers, nanotubes, or nanowires. In some implementations, the conducting helplayer comprises a material selected from: a semiconductor, a conducting polymer, and an alloy. In some implementations, the conducting helplayer is from 1 nm to 100 microns thick. In some implementations, the one or more nanostructures are grown in a plasma.

In some implementations, the one or more nanostructures are carbide derived carbon. In some implementations, the selective removal of the conducting helplayer is accomplished by etching. In some implementations, the etching is plasma dry etching. In some implementations, the etching is an electrochemical etching. In some implementations, the etching is photo chemical pyrolysis etching. In some implementations, the etching is pyrolysis etching. In some implementations, the method further includes depositing an additional layer between the conducting help layer and the layer of catalyst.

According to an aspect, growing a plurality of nanostructures was carried out using the method comprising: depositing a catalyst layer on the electrodes, the catalyst layer comprising grains having an average grain size different from the average grain size of the electrodes, thereby forming a stack of layers comprising the bottom layer and the catalyst layer; heating the stack of layers to a temperature where nanostructures can form and providing a gas comprising a reactant such that the reactant comes into contact with the catalyst layer.

In some implementation, chlorination process is used to derive carbon nanostructures from metal carbide layer e.g. forming carbon nanostructures from TiC.

In some implementation, growing of nanostructure may be carried out using the method comprising: depositing a stack of layers and growing nanostructures on said stack of layers, wherein said stack of layers comprises materials permitting interdiffusion of said layers. Wherein, the interdiffused layers may conveniently be present in the nanostructures. The stack of layers may be combination of different metals, catalyst metals or metal alloys.

In one aspect, such integration of capacitor is suitable by means of controlling the profile size, height and energy density of the capacitor and/or energy storing devices. In one aspect, such integration is suitable by means of controlling the morphology of the grown nanostructures through growth processes suitably enable high surface area per unit area of the nanostructures.

In another aspect of the present invention, such capacitor and or energy storage structures fabricated utilizing any one of the above mentioned methods and processes may be implemented directly on a substrate in combination with other integrated circuits included with active devices. Such active substrate for example be a logic circuit, a microprocessor, a graphic processor, ASIC, CMOS devices, FPGA, analog RF circuits, sensors etc. As an example, an integrated circuit may comprise apart from standard circuit elements, at least one capacitor and/or energy storing device fabricated according to any one of the methods described above. In such embodiments, the capacitor and/or energy storage device is connected directly to the main circuit as per circuit requirements.

In one aspect, such integration of capacitor is suitable by means of controlling the profile size, height and energy density of the capacitor and/or energy storing devices. In one aspect, such integration is suitable by means of controlling the morphology of the grown nanostructures through growth processes suitably enable high surface area per unit area of the nanostructures.

With the method described herein, it is possible to manufacture individual nanostructures, arrays of nanostructures or "forests" of nanostructures.

"Nanostructure" is a structure that has at least one dimension in the order of nanometers.

Nanostructures can include nanofibers, nanotubes or nanowires of carbon, GaAs, ZnO, InP, GaN, InGaN, InGaAs, Si, or other materials. Nanostructure may also be formed by deriving nanostructure from alloys e.g. carbide derived carbon from TiC.

The person skilled in the art realizes that the present invention by no means is limited to the preferred embodiments described above. On the contrary, many modifications and variations are possible within the scope of the appended claims.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A nanostructure energy storage device comprising:
   at least a first plurality of conductive nanostructures provided on an electrically insulating surface portion of a substrate;
   a conduction controlling material embedding each nanostructure in said first plurality of conductive nanostructures;
   a first electrode connected to each nanostructure in said first plurality of nanostructures; and
   a second electrode separated from each nanostructure in said first plurality of nanostructures by said conduction controlling material,
   wherein said first electrode and said second electrode are configured to allow electrical connection of said nanostructure energy storage device to an integrated circuit.

2. The nanostructure energy storage device according to claim 1, wherein at least one of said first electrode and said second electrode is included in a conductor pattern on said substrate.

3. The nanostructure energy storage device according to claim 1, wherein said conductive nanostructures in said first plurality of conductive nanostructures are vertical nanostructures grown on said electrically insulating surface portion of the substrate.

4. The nanostructure energy storage device according to claim 3, further comprising a catalyst layer between said electrically insulating surface portion of the substrate and said conductive nanostructures in said first plurality of conductive nanostructures.

5. The nanostructure energy storage device according to claim 1, wherein said first electrode is arranged between said electrically insulating surface portion of the substrate and each nanostructure in said first plurality of conductive nanostructures.

6. The nanostructure energy storage device according to claim 5, wherein each nanostructure in said first plurality of conductive nanostructures is grown from said first electrode.

7. The nanostructure energy storage device according to claim 1, wherein said conduction controlling material is arranged as a conformal coating on each nanostructure in said first plurality of conductive nanostructures.

8. The nanostructure energy storage device according to claim 1, wherein said second electrode covers said conduction controlling material.

9. The nanostructure energy storage device according to claim 1, wherein said nanostructure energy storage device further comprises a second plurality of conductive nanostructures embedded in said conduction controlling material.

10. The nanostructure energy storage device according to claim 9, wherein said conductive nanostructures in said second plurality of conductive nanostructures are vertical nanostructures grown on said electrically insulating surface portion of the substrate.

11. The nanostructure energy storage device according to claim 10, further comprising a catalyst layer between said electrically insulating surface portion of the substrate and said conductive nanostructures in said second plurality of conductive nanostructures.

12. The nanostructure energy storage device according to claim 10, wherein said second electrode is arranged between said electrically insulating surface portion of the substrate and each nanostructure in said second plurality of conductive nanostructures.

13. The nanostructure energy storage device according to claim 12, wherein each nanostructure in said second plurality of conductive nanostructures is grown from said second electrode.

14. The nanostructure energy storage device according to claim 9, wherein said conduction controlling material is arranged as a conformal coating on each nanostructure in said second plurality of conductive nanostructures.

15. The nanostructure energy storage device according to claim 9, wherein said first electrode covers said first plurality of conductive nanostructures, and said second electrode covers said second plurality of conductive nanostructures.

16. The nanostructure energy storage device according to claim 15, wherein said first electrode is electrically connected to a tip of each nanostructure in said first plurality of nanostructures, and said second electrode is electrically connected to a tip of each nanostructure in said second plurality of nanostructures.

17. The nanostructure energy storage device according to claim 1, wherein said conductive nanostructures are carbon nanostructures.

18. The nanostructure energy storage device according to claim 17, wherein said conductive nanostructures are carbon nanofibers.

19. The nanostructure energy storage device according to claim 1, wherein said nanostructure energy storage device is a nanostructure capacitor, and said conduction controlling material is a dielectric material.

20. The nanostructure energy storage device according to claim 1, wherein said nanostructure energy storage device is a nanostructure battery, and said conduction controlling material is a solid electrolyte.

21. The nanostructure energy storage device according to claim 1, further comprising a conductive helplayer arranged between the nanostructures and the electrically insulating surface portion of the substrate, the conductive helplayer being selectively removed between and around the nanostructures.

22. The nanostructure energy storage device according to claim 1, wherein each of the nanostructures is formed on a stack of layers comprising materials permitting interdiffusion of the layers of materials, wherein the interdiffused materials are present in the nanostructure.

23. An electronic device comprising:
   an integrated circuit; and
   the nanostructure energy storage device according to claim 1 coupled to the integrated circuit.

24. An electronic device, comprising:
an integrated circuit;
a battery; and
a nanostructure energy storage device connected to the battery and to the integrated circuit, the nanostructure energy storage device being configured to be charged by the battery and discharged to the integrated circuit, wherein the nanostructure energy storage device comprises:
a plurality of conductive nanostructures provided on an electrically insulating surface portion of a substrate;
a conduction controlling material embedding each nanostructure in said plurality of conductive nanostructures;
a first electrode connected to each nanostructure in said plurality of nanostructures; and
a second electrode separated from each nanostructure in said plurality of nanostructures by said conduction controlling material,
wherein said first electrode and said second electrode are configured to allow electrical connection of said nanostructure energy storage device to the battery and to the integrated circuit.

25. A electronic device, comprising:
a device substrate;
an integrated circuit; and
an interposer device arranged between the integrated circuit and the device substrate to interconnect the integrated circuit and the device substrate through said interposer device, said interposer device comprising:
an interposer substrate having an electrically insulating surface portion;
a plurality of conducting vias extending through said interposer substrate;
a conductor pattern provided on said electrically insulating surface portion of the interposer substrate, said conductor pattern being conductively connected to said vias and defining connection locations for connection with at least one of said integrated circuit and said device substrate, and
a nanostructure energy storage device comprising:
a plurality of conductive nanostructures provided on said electrically insulating surface portion of the interposer substrate;
a conduction controlling material embedding each nanostructure in said first plurality of conductive nanostructures;
a first electrode connected to each nanostructure in said plurality of nanostructures; and
a second electrode separated from each nanostructure in said plurality of nanostructures by said conduction controlling material,
wherein said first electrode and said second electrode are configured to allow electrical connection of said nanostructure energy storage device to said integrated circuit.

26. The electronic device according to claim 25, further comprising a battery, wherein the interposer device is electrically connected to the battery to allow the nanostructure energy storage device of the interposer device to receive energy from the battery.

* * * * *